United States Patent
Son et al.

(10) Patent No.: US 10,971,341 B2
(45) Date of Patent: Apr. 6, 2021

(54) PLASMA PROCESSING APPARATUS

(71) Applicant: TOKYO ELECTRON LIMITED, Tokyo (JP)

(72) Inventors: Ryou Son, Miyagi (JP); Ryouhei Satou, Miyagi (JP); Yuichi Kuwahara, Miyagi (JP); Syuntaro Tawaraya, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 110 days.

(21) Appl. No.: 16/125,988

(22) Filed: Sep. 10, 2018

(65) Prior Publication Data

US 2019/0088454 A1 Mar. 21, 2019

(30) Foreign Application Priority Data

Sep. 15, 2017 (JP) .............................. JP2017-178099

(51) Int. Cl.
*H01J 37/32* (2006.01)
*H01L 21/67* (2006.01)

(52) U.S. Cl.
CPC .. *H01J 37/32899* (2013.01); *H01J 37/32192* (2013.01); *H01L 21/67069* (2013.01); *H01J 2237/334* (2013.01)

(58) Field of Classification Search
CPC .......... H01J 37/32899; H01J 37/32192; H01J 2237/334; H01L 21/67069
See application file for complete search history.

(56) References Cited

U.S. PATENT DOCUMENTS

2004/0082251 A1* 4/2004 Bach ................. C23C 16/45563
445/60
2007/0158026 A1* 7/2007 Amikura ............... C23C 16/455
156/345.34

FOREIGN PATENT DOCUMENTS

| JP | 62063278 A * | 3/1987 |
| JP | 4896337 B2 | 3/2012 |
| JP | 2012-216614 A | 11/2012 |
| JP | 2013-016443 A | 1/2013 |

* cited by examiner

*Primary Examiner* — Yuechuan Yu
(74) *Attorney, Agent, or Firm* — Studebaker & Brackett PC

(57) ABSTRACT

A plasma processing apparatus includes a processing vessel, an upper structure that is provided on an upper portion of the processing vessel and generates plasma in a lower region thereof, a structure holding ring that is fixed around the upper structure, an arm that supports the ring and is movable up and down, a screw (including a bolt) that is fixed to one of the ring and the arm, and has a tip end abutting the other, and a pin that is provided in the ring or the arm, and passes through a hole for restricting horizontal movement of the ring.

2 Claims, 15 Drawing Sheets

PLASMA PROCESSING APPARATUS

TECHNICAL FIELD

The embodiments of the present invention relates to a plasma processing apparatus.

BACKGROUND

In the related art, plasma processing apparatuses are described in Patent Document 1 (Japanese Unexamined Patent Publication No. 2013-16443), Patent Document 2 (Japanese Unexamined Patent Publication No. 2012-216614), and Patent Document 3 (Japanese Patent No. 4896337). Patent Document 1 discloses a plasma processing apparatus that irradiates an antenna disposed on a dielectric window located at the upper portion of a processing vessel with a microwave to generate plasma in the processing vessel. Patent document 2 discloses a plasma processing apparatus that applies high frequency power to an upper electrode located at the upper portion of a processing vessel to generate plasma in the processing vessel. Patent Document 3 discloses a moving mechanism that moves an upper structure located at the upper portion of a processing vessel up and down using an arm.

Patent Document 1: Japanese Unexamined Patent Publication No. 2013-16443
Patent Document 2: Japanese Unexamined Patent Publication No. 2012-216614
Patent Document 3: Japanese Patent No. 4896337

SUMMARY

However, in the plasma processing apparatus in the related art, the stability of plasma may deteriorate before and after maintenance. Particularly, as shown in Japanese Unexamined Patent Publication No. 2013-16443, it is characterized by generating plasma with high efficiency by the shape of the slot of the antenna and the recessed portion of the dielectric window. However, if the position relationship between the slot and the recessed portion is not always fixed constant by maintenance, the state of plasma generation is different. The embodiments of the present invention have been made in view of such problems, and an object of embodiments of the present invention is to provide a plasma processing apparatus capable of generating stable plasma.

In order to solve the above-described problems, the inventors have conducted intensive studies and found that a ring holding an upper structure may be inclined and distorted at the time of vertical movement during maintenance, and deviates due to heat. This deviation lowers the stability of the plasma.

A plasma processing apparatus according to an aspect of the present invention includes a processing vessel, an upper structure that is provided on an upper portion of the processing vessel and generates plasma in a lower region thereof, a structure holding ring that is fixed around the upper structure, and an arm that supports the ring and is movable up and down. A screw (including a bolt) is fixed to one of the ring and the arm, and has a tip end abutting the other, and a pin is provided in the ring or the arm, and passes through a hole for restricting horizontal movement of the ring.

In this case, when the upper structure is moved upward, even if the upper structure (and the ring) is inclined with respect to the arm due to its own weight, the distance between the arm and the ring is constant in a place where they are fixed relative to each other by a screw and the pin can move axially within the hole, so that the ring can freely move up and down in this position. That is, even if the upper structure (and the ring) is inclined with respect to the arm, if the ring is placed on a horizontal plane, the pin can freely move within the hole, so that the inclination of the upper structure is restored and becomes horizontal. According to this structure, even when the upper structure is inclined with respect to the arm in the case of upward movement, it is restored to its original position after being moved downward, so that the positioning of the upper structure is accurately performed and stable plasma is generated.

Further, it is preferable that the tip end of the screw is made of a ball that is rotatably held. In this case, even if the ring moves slightly in the horizontal direction, unnecessary horizontal force is not applied to the upper structure due to the presence of the ball, so that the positioning of the upper structure is accurately performed, and stable plasma is generated.

In addition, the number of the screws is three or more. Since the plane includes three points, if the number of screws is three or more, the distance between the ring and the arm which the screw restricts can be adjusted in three places, therefore, by adjusting the screws, the upper surface of the ring can be held horizontally.

According to the plasma processing apparatus, stable plasma can be generated.

DETAILED DESCRIPTION

Figure 1:
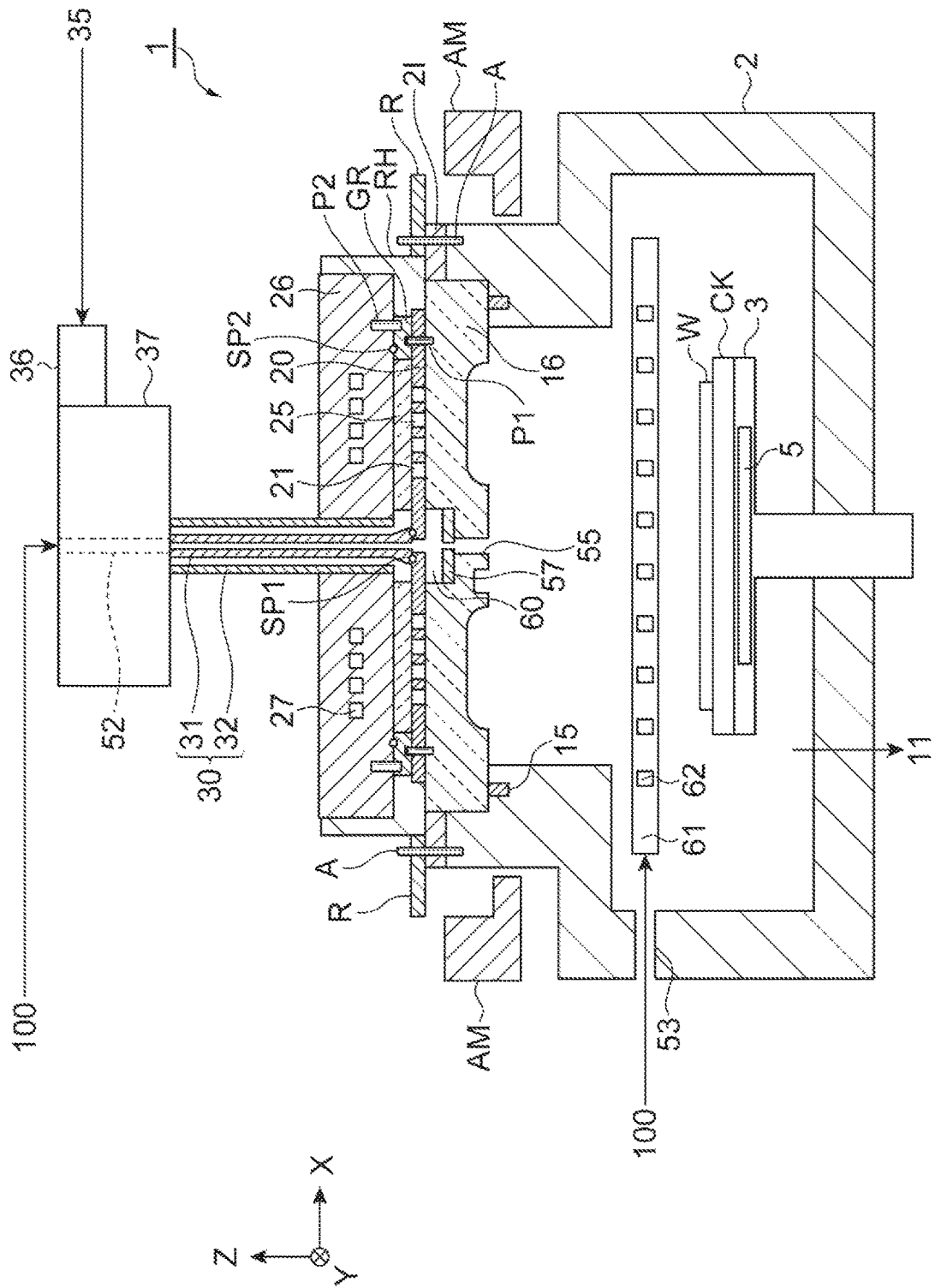
FIG. 1 is a diagram illustrating a basic longitudinal sectional configuration of a plasma processing apparatus.

Hereinafter, an embodiment of the present invention will be described with reference to the drawings. In the present specification and drawings, substantially the same constituent elements are denoted by the same reference numerals.

Figure 2:
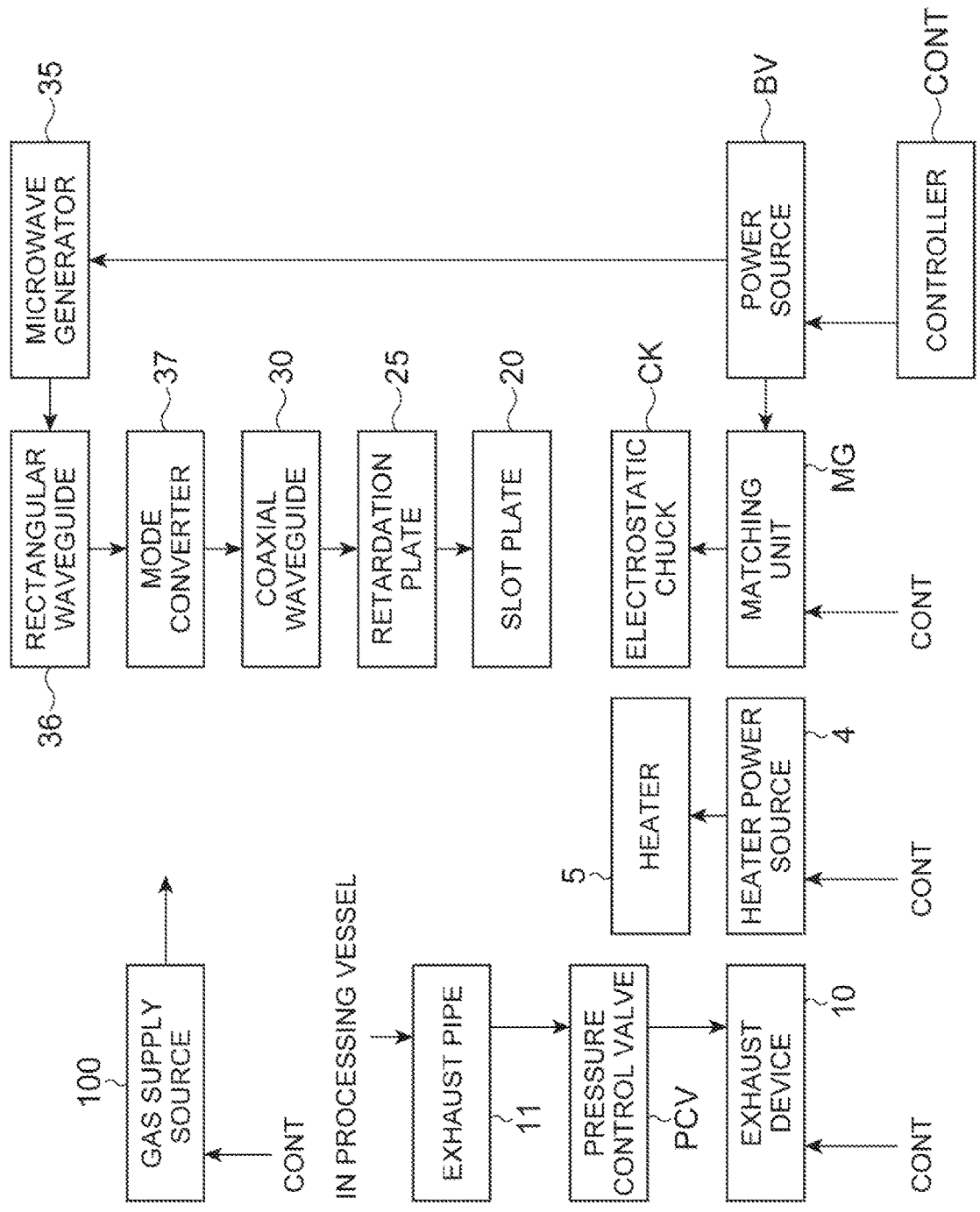
FIG. 2 is a block diagram illustrating a configuration of a control system of the plasma processing apparatus shown in FIG. 1.

FIG. 1 is a longitudinal sectional view of a plasma processing apparatus according to an embodiment of the present invention, and FIG. 2 is a block diagram illustrating a configuration of a control system of the plasma processing apparatus shown in FIG. 1.

A plasma processing apparatus 1 includes a cylindrical processing vessel 2. The ceiling portion of the processing vessel 2 is closed with a dielectric window (top plate) 16 made of a dielectric material. The processing vessel 2 is made of, for example, aluminum and is electrically grounded. The inner wall surface of the processing vessel 2 is covered with an insulating protective film such as alumina.

A base 3 for placing a semiconductor wafer (hereinafter referred to as a wafer) W, which is a substrate, is provided at the center of the bottom of the processing vessel 2. The wafer W is held on the upper surface of the base 3. The base 3 is made of a ceramic material such as alumina or aluminum nitride, for example. A heater 5 is embedded in the base 3 such that the wafer W can be heated to a predetermined temperature. The heater 5 is connected to a heater power source 4 through the wiring disposed in the support (see FIG. 2).

On the upper surface of the base 3, an electrostatic chuck CK electrostatically chucking the wafer W placed on the base 3 is provided. The electrostatic chuck CK is connected to a biasing power source BV applying bias direct current or high-frequency power through a matching unit MG (see FIG. 2).

An exhaust pipe 11 for exhausting the processing gas from an exhaust port below the surface of the wafer W placed on the base 3 is provided at the bottom of the processing vessel 2. An exhaust device 10 such as a vacuum pump is connected to the exhaust pipe 11 through a pressure control valve PCV (see FIG. 2). The exhaust device 10 communicates with the inside of the processing vessel 2 through the pressure control valve PCV. By the pressure control valve PCV and the exhaust device 10, the pressure in the processing vessel 2 is adjusted to a predetermined pressure.

A dielectric window 16 is provided on the ceiling portion of the processing vessel 2 through a seal 15 such as an O ring for securing airtightness. The dielectric window 16 is made of a dielectric material such as quartz, alumina ($Al_2O_3$), aluminum nitride (AlN), or the like, and has permeability to a microwave.

On the upper surface of the dielectric window 16, a disk-shaped slot plate 20 is provided. The slot plate 20 is made of a material having conductivity, for example, copper plated or coated with Ag, Au or the like. In the slot plate 20, a plurality of slots 21 of a T shape or an L shape, for example, are concentrically arranged.

On the upper surface of the slot plate 20, a retardation plate 25 for compressing the wavelength of the microwave is disposed. The retardation plate 25 is made of a dielectric material such as quartz ($SiO_2$), alumina ($Al_2O_3$), aluminum nitride (AlN), or the like. The retardation plate 25 is covered with a conductive cover 26 made of aluminum or the like. An annular heat medium flow path 27 is provided in a temperature control jacket (cover) 26. The cover 26 and the retardation plate 25 are adjusted to a predetermined temperature by the heat medium flowing through the heat medium flow path 27. Taking a microwave with a wavelength of 2.45 GHz as an example, the wavelength in the vacuum is about 12 cm, and the wavelength in the dielectric window 16 made of alumina is about 3 to 4 cm.

A coaxial waveguide 30 that propagates microwaves is connected to the center of the cover 26. The coaxial waveguide 30 includes an inner conductor 31 and an outer conductor 32. The inner conductor 31 penetrates the center of the retardation plate (dielectric plate) 25 and is connected to the center of the slot plate 20.

As shown in FIG. 1, a microwave generator 35 is connected to the coaxial waveguide 30 through a mode converter 37 and a rectangular waveguide 36. With respect to the microwave, a microwave of 860 MHz, 915 MHz, 8.35 GHz or the like in addition to 2.45 GHz can be used.

The microwave generated by the microwave generator 35 propagates to the rectangular waveguide 36, the mode converter 37, the coaxial waveguide 30, and the retardation plate 25, which are microwave introduction paths. The microwave propagating to the retardation plate 25 is supplied into the processing vessel 2 from the plurality of slots 21 of the slot plate 20 through the dielectric window 16. An electric field is formed by microwaves below the dielectric window 16, and the processing gas in the processing vessel 2 is turned into plasma.

The lower end of the inner conductor 31 connected to the slot plate 20 is formed in a truncated cone shape. Thus, microwaves are efficiently propagated without loss from the coaxial waveguide 30 to the retardation plate 25 and the slot plate 20.

The feature of the microwave plasma generated by the radial line slot antenna is that the plasma having an energy of a relatively high electron temperature generated in the region (referred to as a plasma excitation region) immediately below the dielectric window 16 is diffused, and plasma of a low electron temperature of about 1 to 2 eV is obtained in the region (diffusion plasma region) immediately above the wafer W. That is, unlike plasma in parallel flat plates, or the like, the distribution of the electron temperature of the plasma clearly occurs as a function of the distance from the dielectric window 16. More specifically, the electron temperature of several eV to about 10 eV in the region immediately below the dielectric window 16 is attenuated to about 1 to 2 eV in the region above the wafer W. Since the wafer W is processed in a region with a low electron temperature of the plasma (diffusion plasma region), the wafer W is not damaged significantly by a recess or the like. When a processing gas is supplied to a region with a high electron temperature of the plasma (plasma excitation region), the processing gas is easily excited and dissociated. On the other hand, when a processing gas is supplied to a region with a low electron temperature of the plasma (plasma diffusion region), the degree of dissociation is suppressed, as compared with the case where the processing gas is supplied to the vicinity of the plasma excitation region.

In the center of the dielectric window 16 of the ceiling portion of the processing vessel 2, a central introduction portion 55 for introducing processing gases to the center of the wafer W is provided. In the inner conductor 31 of the coaxial waveguide 30, a processing gas supply path 52 is formed. The central introduction portion 55 is connected to the supply path 52.

The central introduction portion 55 includes a columnar block 57 fitted in a cylindrical space portion provided in the center of the dielectric window 16, a gas reservoir 60 which is spaced apart from the lower surface of the inner conductor 31 of the coaxial waveguide 30 and the upper surface of the block 57 at an appropriate interval, and a tapered space portion in which a columnar space having an opening for gas ejection is continuous at the tip end. The block 57 is made of a conductive material such as aluminum, for example, and is electrically grounded. A plurality of central introduction ports penetrating in the vertical direction are formed in the block 57. The shape of the space portion is not limited to a tapered shape, and may be a simple columnar shape. The planar shape of the central introduction port is formed into a perfect circle or a long hole in consideration of necessary conductance and the like. An aluminum block 57 is coated with anodic oxide film alumina ($Al_2O_3$), yttria ($Y_2O_3$) or the like.

The processing gas supplied from the supply path 52 penetrating the pipe-like inner conductor 31 to the gas reservoir 60 is diffused inside the gas reservoir 60, and then injected from a plurality of central introduction ports in the block 57 downward and toward the center of the wafer W.

A ring-shaped peripheral introduction portion 61 that supplies the processing gas to the peripheral portion of the wafer W is disposed inside the processing vessel 2 so as to surround the upper periphery of the wafer W. The peripheral introduction portion 61 is disposed below the central introduction port disposed in the ceiling portion and above the wafer W placed on the base 3. The peripheral introduction portion 61 is formed by annularly disposing a hollow pipe, and a plurality of peripheral introduction ports 62 are formed on the inner peripheral side with a constant interval in the circumferential direction. The peripheral introduction ports 62 inject the processing gas toward the center of the peripheral introduction portion 61. The peripheral introduction portion 61 is made of, for example, quartz. A supply path 53 made of stainless steel penetrates the side surface of the processing vessel 2. The supply path 53 is connected to the peripheral introduction portion 61. The processing gas supplied from the supply path 53 into the peripheral introduction portion 61 is diffused in the space inside the peripheral introduction portion 61, and then injected from the plurality of peripheral introduction ports 62 toward the inside of the peripheral introduction portion 61. The processing gas injected from the plurality of peripheral introduction ports 62 is supplied to the upper peripheral portion of the wafer W. Instead of providing the ring-shaped peripheral introduction portion 61, the plurality of peripheral introduction ports 62 may be formed on the inner surface of the processing vessel 2.

A gas supply source 100 supplies gas to the central introduction port and the peripheral introduction portion 61. For example, as a gas used for the gas supply source 100, a rare gas (such as Ar) can be used, but other additive gases can be used. When etching a silicon-based film of polysilicon or the like, Ar gas, HBr gas (or $Cl_2$ gas), and $O_2$ gas are supplied as an additive gas. When an oxide film of $SiO_2$ or the like is etched, Ar gas, CHF-based gas, CF-based gas, and $O_2$ gas are supplied as an additive gas $G_{21}$, $G_{22}$, $G_{23}$, $G_{2x}$. When a nitride film of SiN or the like is etched, Ar gas, CF-based gas, CHF-based gas, $O_2$ gas are supplied as an additive gas.

Incidentally, examples of the CHF-based gas include $CH_3(CH_2)_3CH_2F$, $CH_3(CH_2)_4CH_2F$, $CH_3(CH_2)_7CH_2F$, $CHCH_3F_2$, $CHF_3$, $CH_3F$ and $CH_2F_2$.

Examples of the CF-based gas include $C(CF_3)_4$, $C(C_2F_5)_4$, $C_4F_8$, $C_2F_2$, and $C_5F_8$, and $C_5F_8$ is preferable from the viewpoint of obtaining dissociated species suitable for etching.

The gas supply source 100 can also supply a cleaning gas such as $O_2$, and $SF_6$, or other common gases.

Here, for the purpose of generating uniform plasma and processing the wafer W uniform in the plane, the branching ratio of the common gas may be adjusted by the flow splitter and the gas introduction amount from the central introduction portion 55 and the peripheral introduction portion 61 may be adjusted.

In the plasma processing apparatus shown in FIG. 1, a plasma generating unit constituting an upper structure includes a dielectric window 16, a slot plate 20 provided on the dielectric window 16, and a coaxial waveguide 30 electrically connected to the slot plate 20 in order to propagate microwaves.

The coaxial waveguide 30 includes a pipe-shaped inner conductor 31 and a pipe-shaped outer conductor 32 surrounding the inner conductor 31. The inner conductor 31 is in contact with the central portion of the slot plate 20, but various positioning members are disposed in the peripheral part of the slot plate 20. A retardation plate guide ring GR is disposed on the slot plate 20 and an inner surface of the retardation plate guide ring GR restricts the position of the retardation plate 25 in the XY plane. A second position fixing pin P2 extending in the vertical direction is interposed between the retardation plate 25 and the temperature control jacket 26. The first position fixing pin P1 provided on the upper surface of the dielectric window 16 penetrates the slot plate 20 and is inserted into the recessed portion of the retardation plate guide ring GR. Therefore, the positions of the slot plate 20 and the retardation plate 25 are restricted so as to be relatively difficult to move with respect to the dielectric window 16.

The retardation plate 25 compresses the wavelength of the microwave propagating through the coaxial waveguide 30. Since the position of the retardation plate 25 is restricted by the retardation plate guide ring GR on the slot plate 20, the accuracy of positioning between the slot plate 20 and the retardation plate 25 can be improved. The temperature control jacket 26 can adjust the temperature of the retardation plate 25, the coaxial waveguide 30, the slot plate 20, and the like, which are thermally connected thereto. The temperature control jacket 26 has a passage in which a fluid for temperature control flows, and when the cooled medium flows in the passage, the component thermally connected to the passage is cooled.

The plasma generating unit has a first position fixing pin P1 provided between the dielectric window 16 and the retardation plate guide ring GR through a positioning hole provided in the slot plate 20 and a second position fixing pin P2 provided between the temperature control jacket 26 and the retardation plate guide ring GR. According to this structure, the positions of the dielectric window 16, the slot plate 20, and the retardation plate guide ring GR are fixed by the first position fixing pin P1 and the second position fixing pin P2. The number of position fixing pins is plural in the same XY plane.

A second spring SP 2 is interposed between the temperature control jacket 26 and the retardation plate guide ring GR. A first spring SP1 is disposed between the inner conductor 31 and the slot plate 20.

The slot plate 20, the retardation plate guide ring GR, and the temperature control jacket 26 are provided with a ring-shaped hold member RH surrounding and holding the periphery thereof, and a ring R fixed to the hold member RH. Note that the hold member RH and the ring R may be integrally formed. Further, any two or more or all of the components of the retardation plate guide ring GR, the temperature control jacket 26, the hold member RH, and the ring R may be integrally formed.

The ring R is a structure holding ring fixed around the upper structure, and an arm AM which supports the ring R and is movable up and down is disposed in a lower portion of the ring R. In a state where the ring R is supported on the upper surface of the arm AM, when the arm AM is moved upward, the ring R moves upward, and when the arm AM is moved downward, the ring R moves downward.

The ring R is positioned on a ring-shaped spacer 21 located on the upper end opening of the processing vessel 2. Like the processing vessel 2, the spacer 21 is made of, for example, a conductor made of aluminum, or an insulator such as $SiO_2$, alumina, or ceramic. The movement of the ring R in the horizontal direction (in the XY plane direction) is restricted by the pin A with respect to the spacer 21. That is, the pin A is inserted into the spacer 21 and the hole provided in the processing vessel 2, and penetrates the through hole of the ring R. The interval between the slot plate 20 and the wafer W can be changed by changing the thickness of the spacer 21, changing the thickness of the dielectric window 16, or inserting a new spacer between the dielectric window 16 and the seal 15. Accordingly, the spread of the diffusion plasma region can be adjusted, and the attenuation amount of the electron density on the wafer W can be changed.

Figure 3:
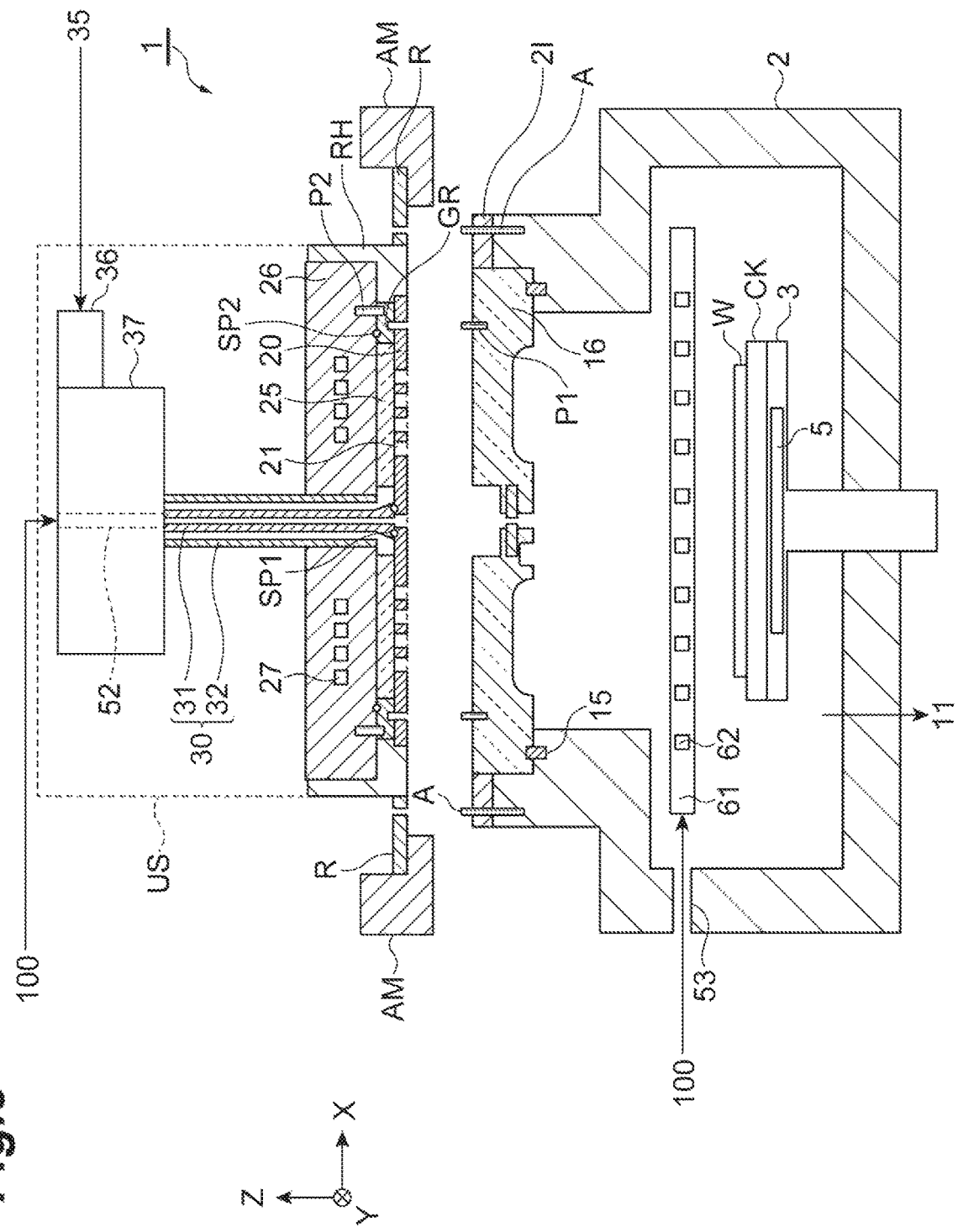
FIG. 3 is a view illustrating a state in which an upper structure of the plasma processing apparatus is lifted.

FIG. 3 is a view illustrating a state in which an upper structure of the plasma processing apparatus is lifted.

The upper structure US includes a slot plate 20, a retardation plate 25, a temperature control jacket 26, a coaxial waveguide 30, a mode converter 37, and a rectangular waveguide 36. In the following description, for clarification of explanation, the upper structure US shown in the rectangle of the dotted line in FIG. 3 will be described by showing it as a block as shown in FIG. 2.

Figure 4:
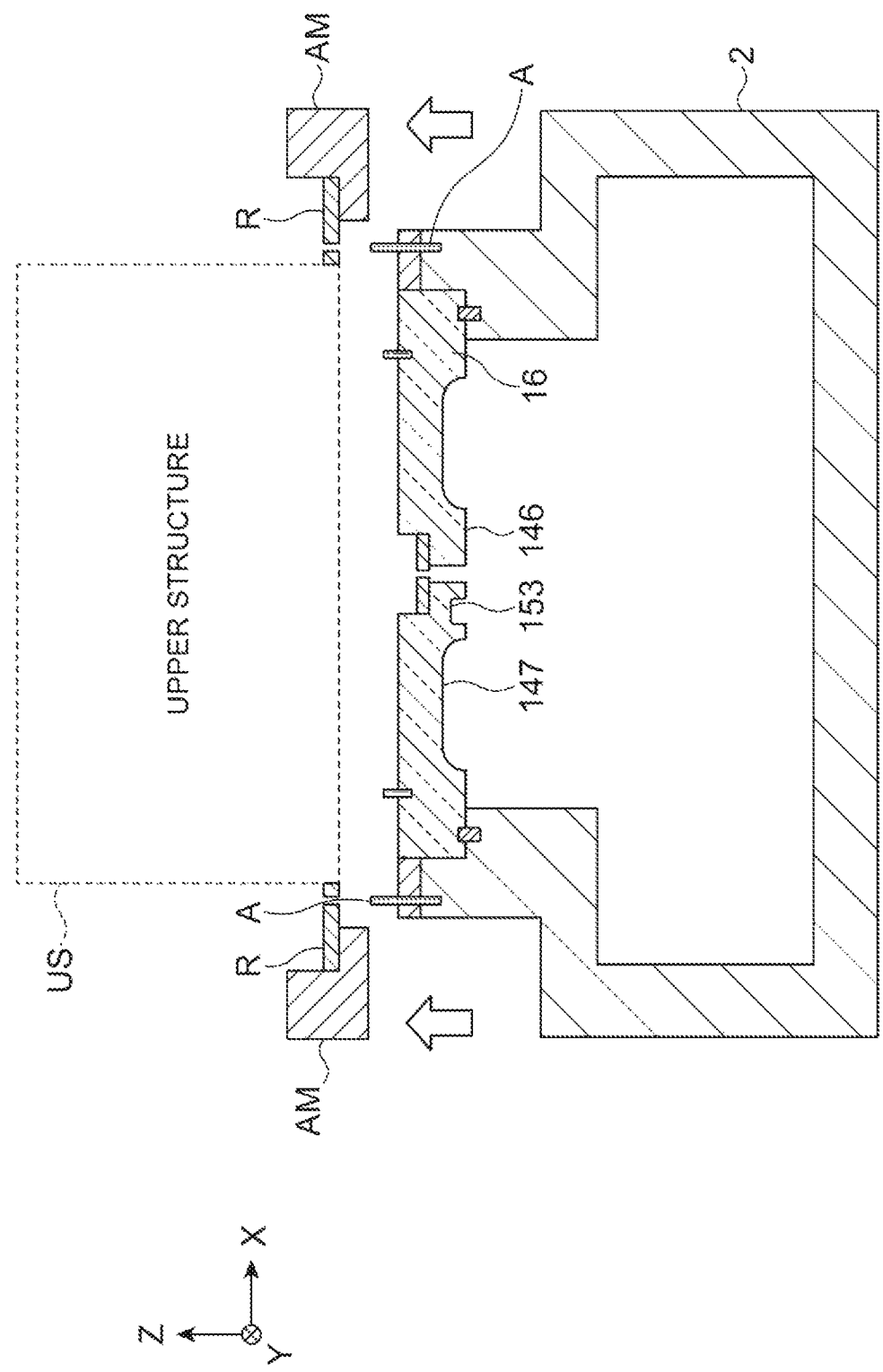
FIG. 4 is a diagram illustrating the structure shown in FIG. 3 in a simplified manner.

FIG. 4 is a diagram illustrating the structure shown in FIG. 3 in a simplified manner.

An annular first recessed portion 147 which is annularly continuous and is recessed in a tapered shape inward in the plate thickness direction of the dielectric window 16 is provided in a radially outer region of the lower flat surface 146 which is the side where plasma is generated when it is provided in the plasma processing apparatus, in the dielectric window 16. The flat surface 146 is provided in the radial center region of the dielectric window 16. On the central flat surface 146, a circular second recessed portion 153 is formed at equal intervals along the circumferential direction. The annular first recessed portion 147 has an inner tapered surface with a tapered shape from the outer diameter region toward the outer diameter side of the flat surface 146, specifically, which is inclined with respect to the flat surface 146, a flat bottom surface which extends straight in the radial direction toward the outer diameter side from the inner tapered surface, that is, extends parallel to the flat surface 146, and an outer tapered surface with a tapered shape from the bottom surface toward the outer diameter side, specifically, which extends obliquely with respect to the bottom surface.

A slot plate is included in the upper structure US, but the alignment accuracy between the slot plate and the first recessed portion 147 and second recessed portion 153 affects the stability of the plasma. Various types of slot patterns of the slot plate have been known, and various shapes of recessed portions in the dielectric window 16 have been known. For example, a slot pattern in which slots of an L type are arranged along the circumference, a slot pattern in which inclinations of the slots in the longitudinal direction are alternately different along the circumferential direction, and the like have been known.

Figure 5:
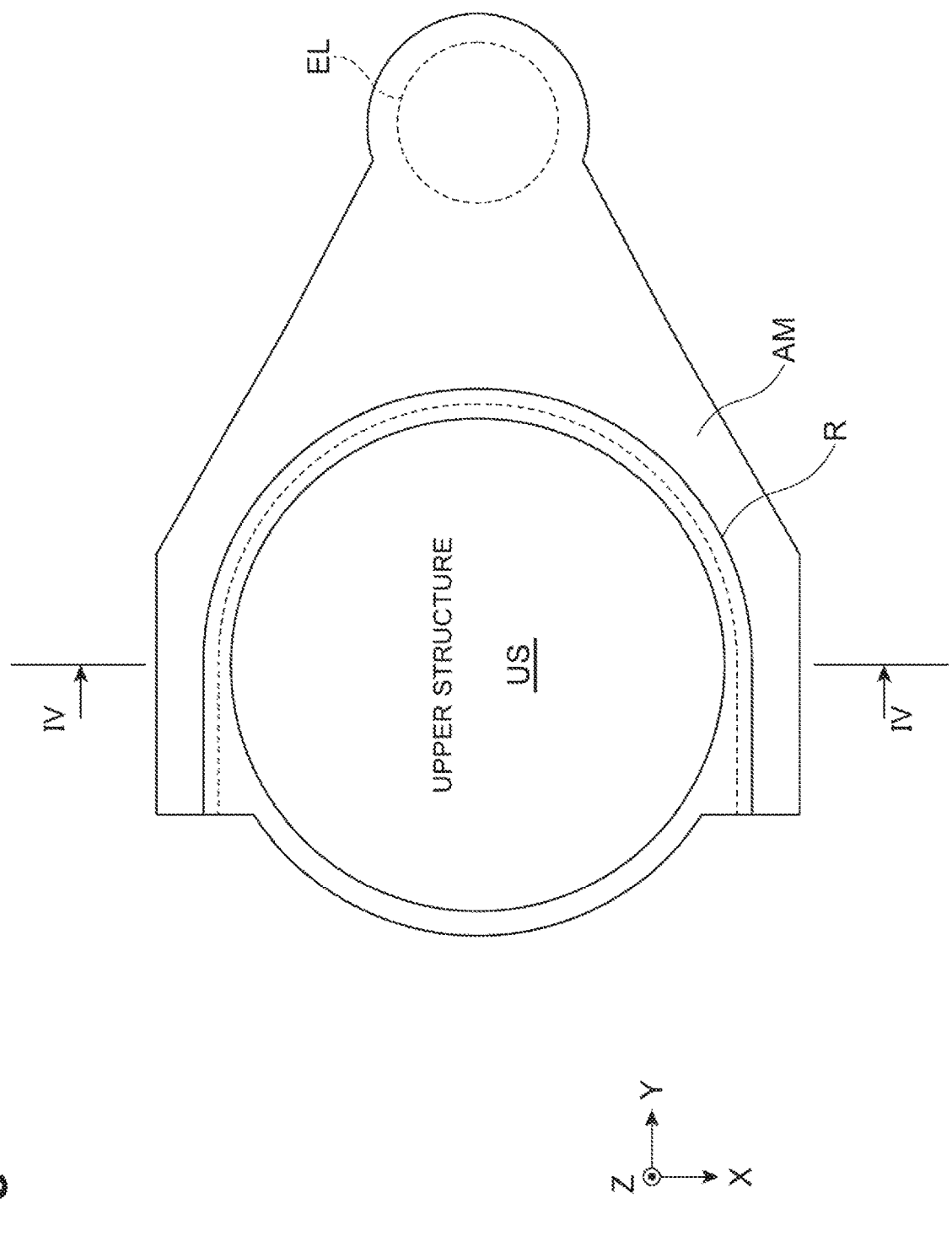
FIG. 5 is a top view of the plasma processing apparatus shown in FIG. 4.

FIG. 5 is a top view of the plasma processing apparatus shown in FIG. 4, in which the longitudinal sectional structure of the IV-IV arrow line is the structure of FIG. 4.

The ring R is disposed on an arm AM having a fork shape. The base portion of the arm AM is fixed to the lifting device EL and can move in the Z-axis direction. Since the lifting device EL can also rotate in the XY plane, the arm AM can also move in the XY plane. Since the inner surface of the fork has a step, the ring R can be disposed on the lower-step surface of the stepped portion.

Figure 6:
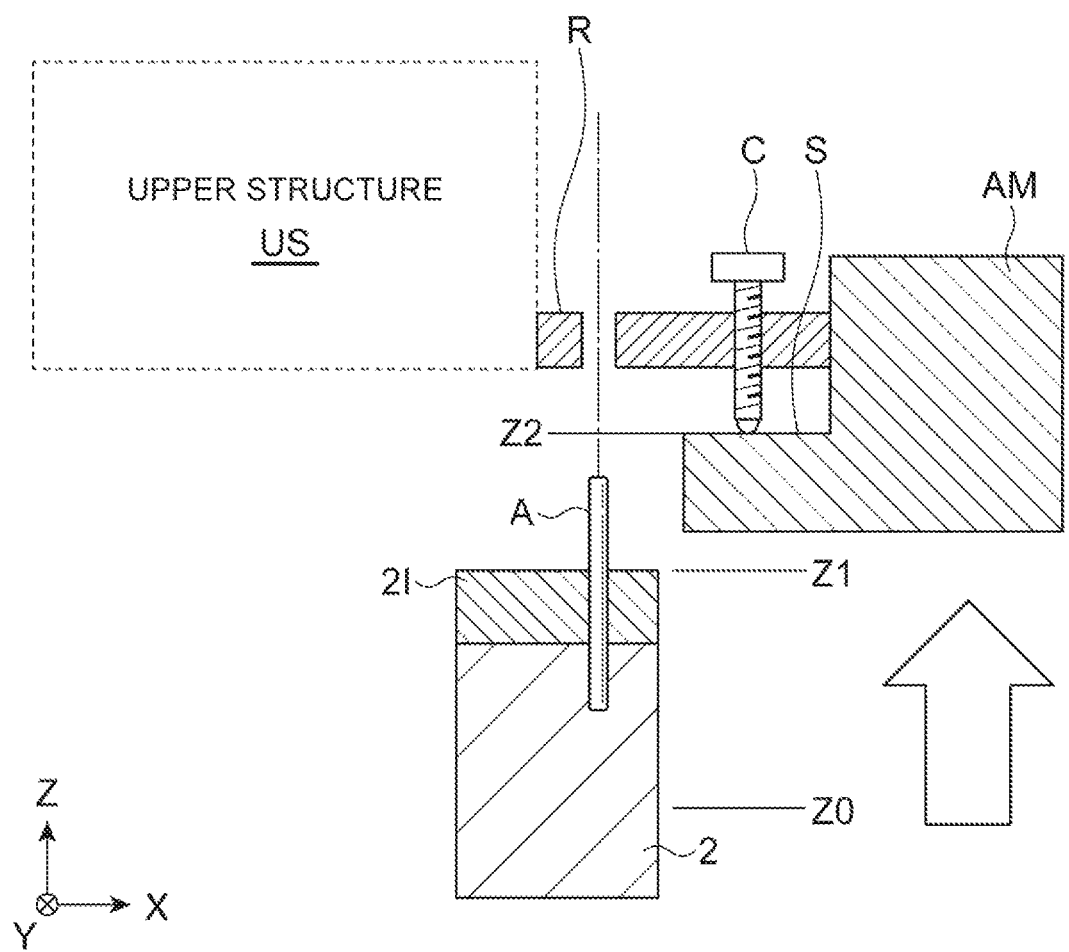
FIG. 6 is a view illustrating a longitudinal cross section (XZ cross section) in the vicinity of an arm of the plasma processing apparatus shown in FIG. 5.

FIG. 6 is a view illustrating a longitudinal cross section (XZ cross section) in the vicinity of an arm of the plasma processing apparatus shown in FIG. 5.

FIG. 6 is a view obtained by seeing the arm AM from the Y-axis direction. The tip end of the screw C abuts the lower-step surface (referred to as the reference surface S) of the step portion of the arm AM. The screw C is screwed into the ring through a screw hole provided in the ring R, and the tip end pushes the reference surface S of the arm AM downward. The distance (Z direction) between the ring R and the arm AM can be adjusted by the amount of rotation of the screw C. The ring R is also provided with a through hole through which the pin A passes.

In the initial position of the arm AM, assuming that the reference surface S is at the initial position Z0 in the Z-axis direction, the reference surface S is in the second position Z2 in FIG. 6. The second position Z2 is located at a position higher than the first position Z1 on the upper surface of the spacer 21 with which the ring R is in contact. In a case of raising the arm AM from the initial position Z0, first, the reference surface S abuts the tip end of the screw C, and then the ring R is raised by the force applied to the screw C from below.

After the maintenance of the apparatus is finished, the arm AM is lowered downward to the initial position Z0, but it can temporarily stop at the first position Z1 while lowering the arm AM. In this case, although the pin A penetrates the through hole of the ring R, the ring R and the spacer 21 do not abut but are separated from each other by the length of the tip end of the screw C protruding from the lower surface of the ring R. Further, a ball held rotatably is embedded in the tip end of the screw C. Therefore, the ball at the tip end of the screw C slides on the reference surface S, and the ring R and the upper structure US can be horizontally moved.

Figure 7:
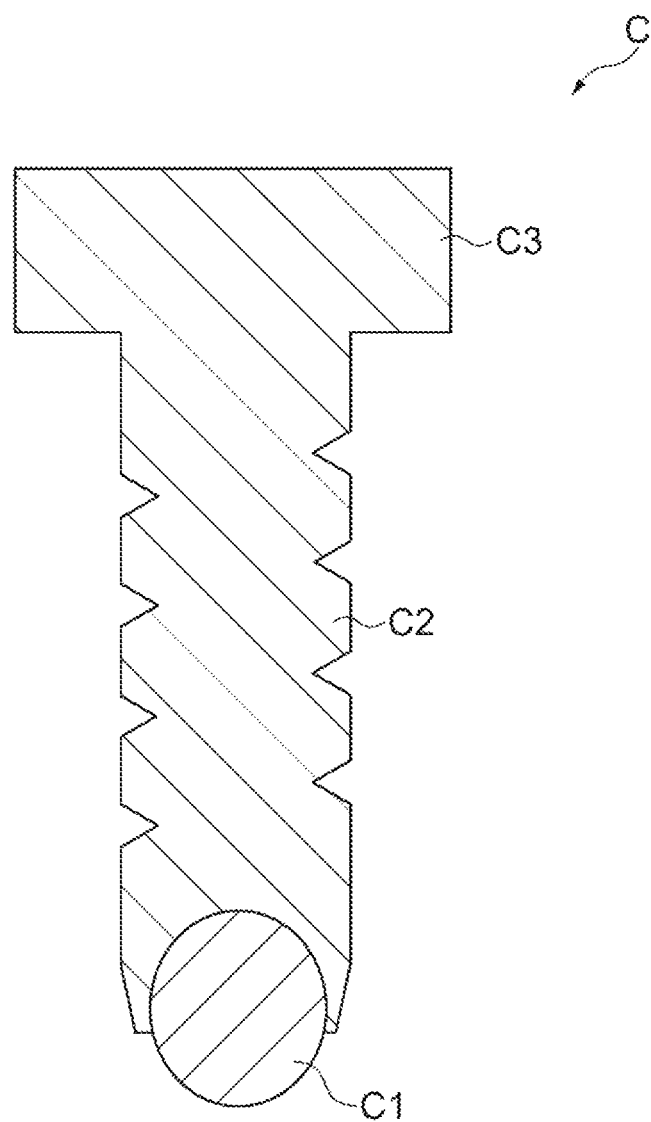
FIG. 7 is a cross-sectional view of a screw (clamping screw).

FIG. 7 is a cross-sectional view of the screw C (clamping screw).

The screw C includes a ball C1 provided at the tip end, a screw portion C2 holding a ball and having threads formed therearound, and a head portion C3 having a polygonal planar shape used for rotating the screw. The ball C1 can freely rotate in either direction. The screw C is a complete ball type clamping screw.

Figure 8:
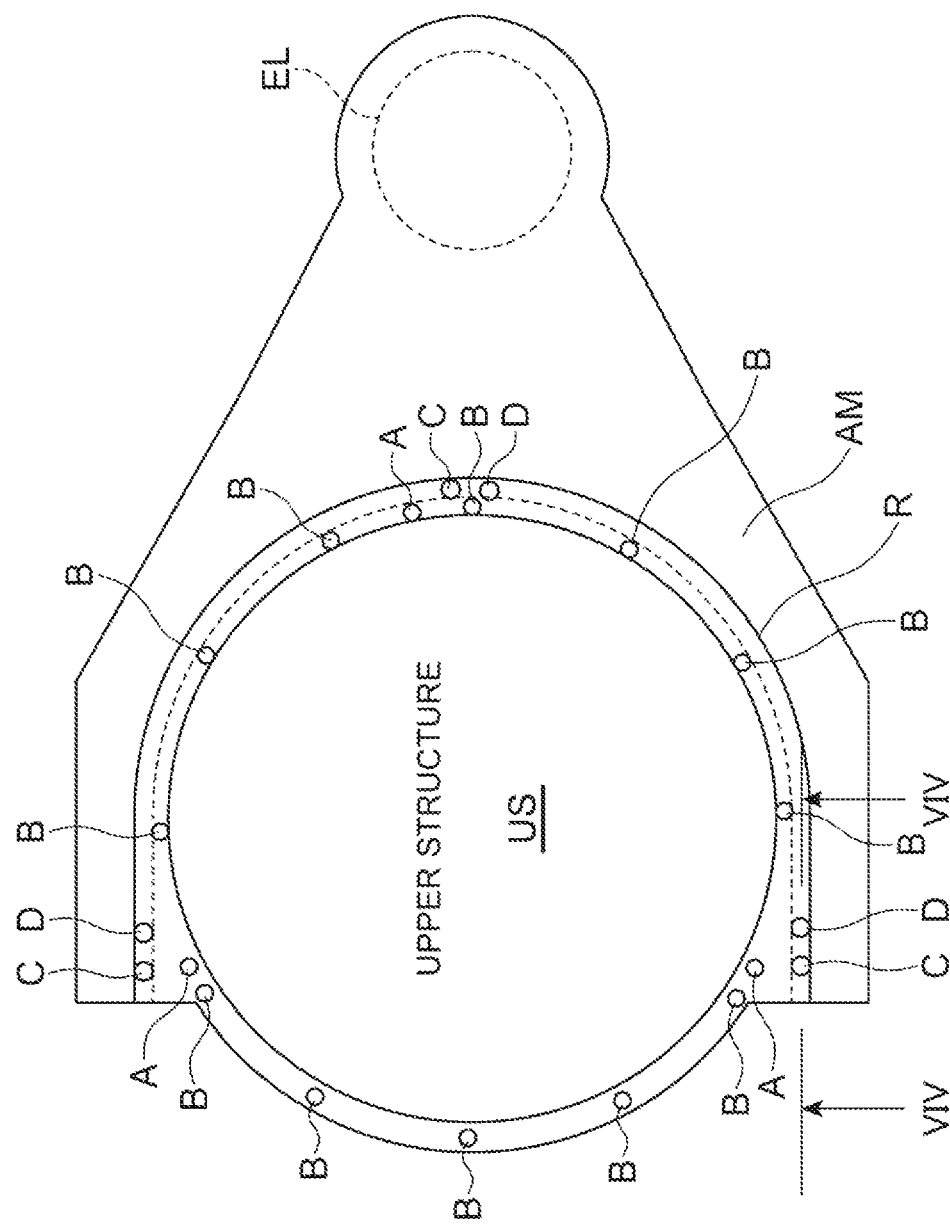
FIG. 8 is a top view of a plasma processing apparatus including a screw.
Figure 9:
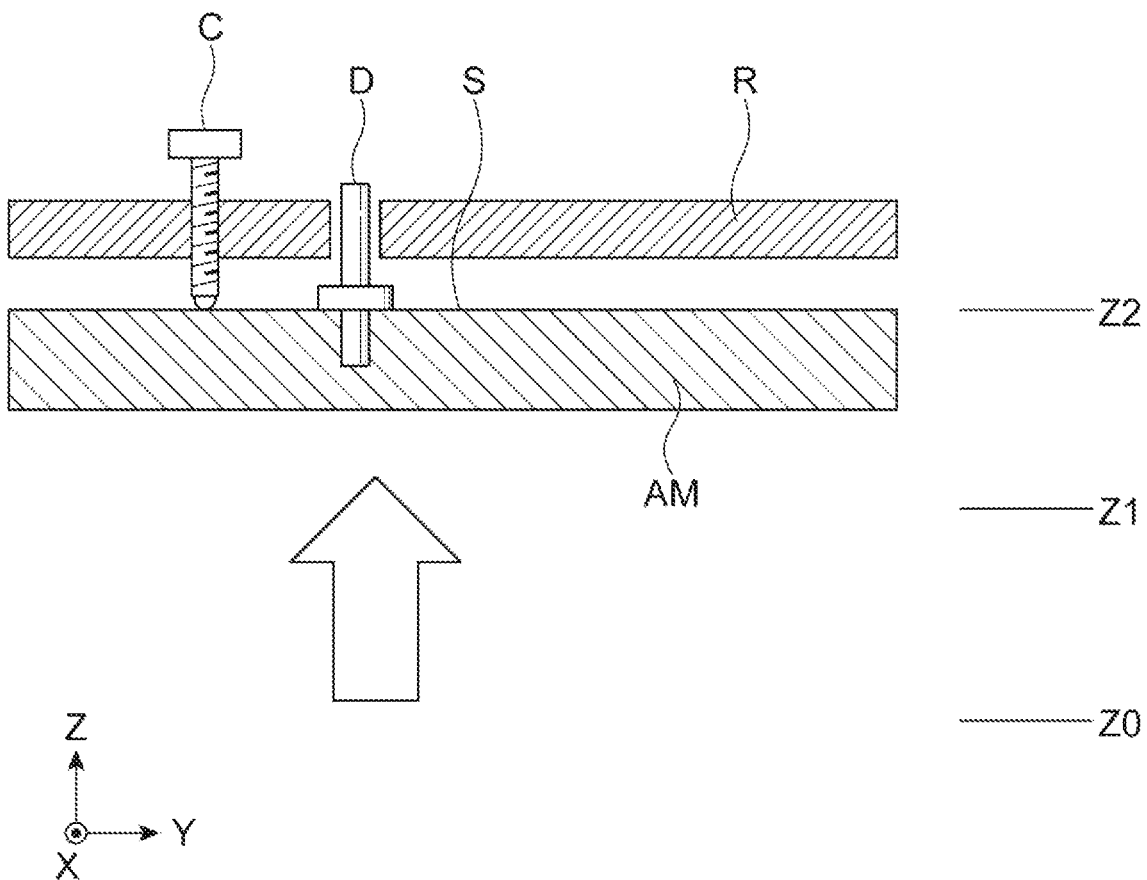
FIG. 9 is a view illustrating a longitudinal cross section (YZ cross section) in the vicinity of an arm of the plasma processing apparatus shown in FIG. 8.

FIG. 8 is a top view of a plasma processing apparatus including a screw. FIG. 9 is a view illustrating a longitudinal cross section (YZ cross section) in the vicinity of an arm of the plasma processing apparatus shown in FIG. 8. The longitudinal sectional structure of the VIV-VIV arrow line in FIG. 8 is the structure of FIG. 9.

Figure 10:
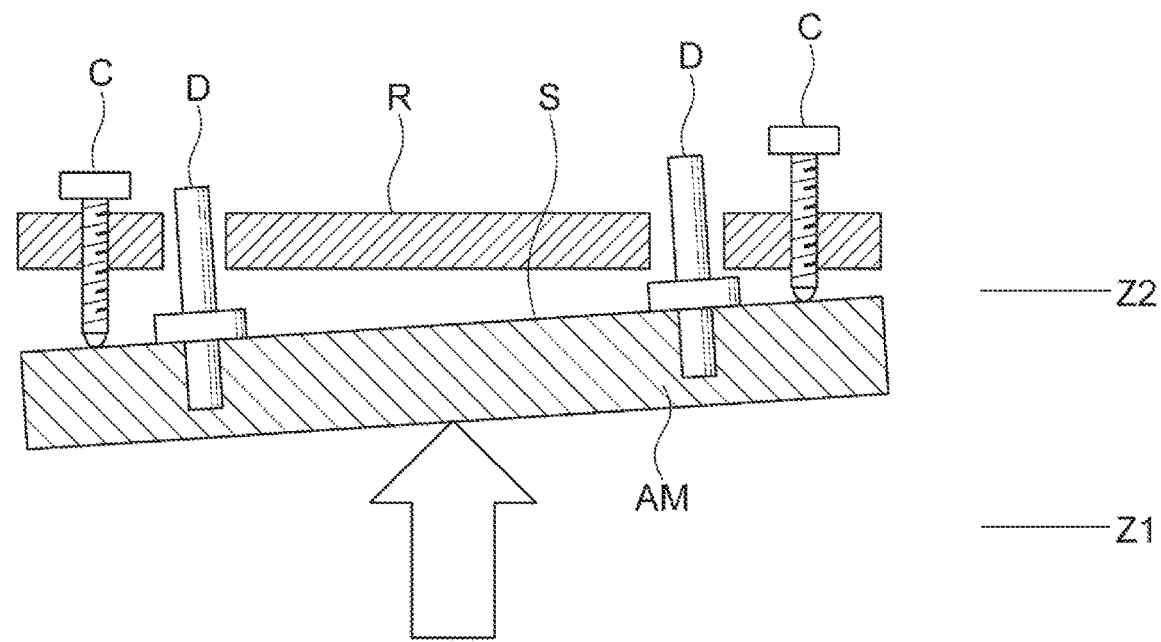
FIG. 10 is a view illustrating a longitudinal sectional configuration in the vicinity of the arm in the case where there are two pairs of screws C and pins D, which are separated along a Y-axis direction.

In FIG. 9, a longitudinal sectional configuration in the vicinity of a pair of screw C and pin D is shown. FIG. 10 shows a longitudinal sectional configuration in the case where there are two pairs of screw C and pin D, which are separated along the Y-axis direction. It may be considered that the pair on the right side in FIG. 10 is shown by rotating the pair of C-D closest to the lifting device EL in FIG. 8 by 90 degrees around the Z axis. In this case, when the arm AM is pushed upward (the first position Z1 or the second position Z2) from the initial position Z0 (FIG. 9, FIG. 10), the tip end of the screw C abuts the arm AM, and the pin D extended from the arm AM passes through a through hole provided in the ring R. The shape of the pin D is a shape in which one annular ring is provided around the columnar shaft, and the lower surface of the annular portion is in contact with the reference surface of the arm AM.

The screws C are disposed at a plurality of places on the ring R. Although the arm AM is deflected due to its own weight of the upper structure and the rings R and the upper structure US are inclined, the upper structure can be kept horizontal by adjusting the rotation speed of each of the screws C at a plurality of places (the distance between the lower surface of the ring R immediately below the screw and the reference surface S (the downward protrusion distance of the screw C)) and adjusting the distance between the ring R and the arm AM. For example, by making the downward projecting distance of the screw C closer to the lifting device EL shorter than the downward projecting distance of the screw C far from the lifting device EL, the upper surface of the ring R is held horizontally, so that the upper structure US can be held horizontally. Therefore, it is preferable that three or more screws C are provided. Specifically, since the plane includes three points, if the number of screws is three or more, the distance between the ring R and the arm AM which the screw restricts can be adjusted in three places, therefore, by adjusting the screws, the upper surface of the ring R can be held horizontally. The pin D is provided in the vicinity of one screw C. The pin D extends upward from the reference surface of the arm AM and passes through a through hole provided in the ring R. That is, the function of the pin D is to restrict the movement of the ring R in the XY plane, but the ring R is free from the pin D with respect to the vertical movement.

For the screw C and the pin D in the embodiment, the members to be fixed may be opposite.

By lowering the arm AM from the first position Z1 to the initial position Z0 after completing the adjustment of the position and the degree of horizontalness of the upper structure US in the XY plane with respect to the dielectric window 16, the ring R abuts the spacer 21 and the tip end of the screw C and the arm AM are separated from each other.

Figure 11:
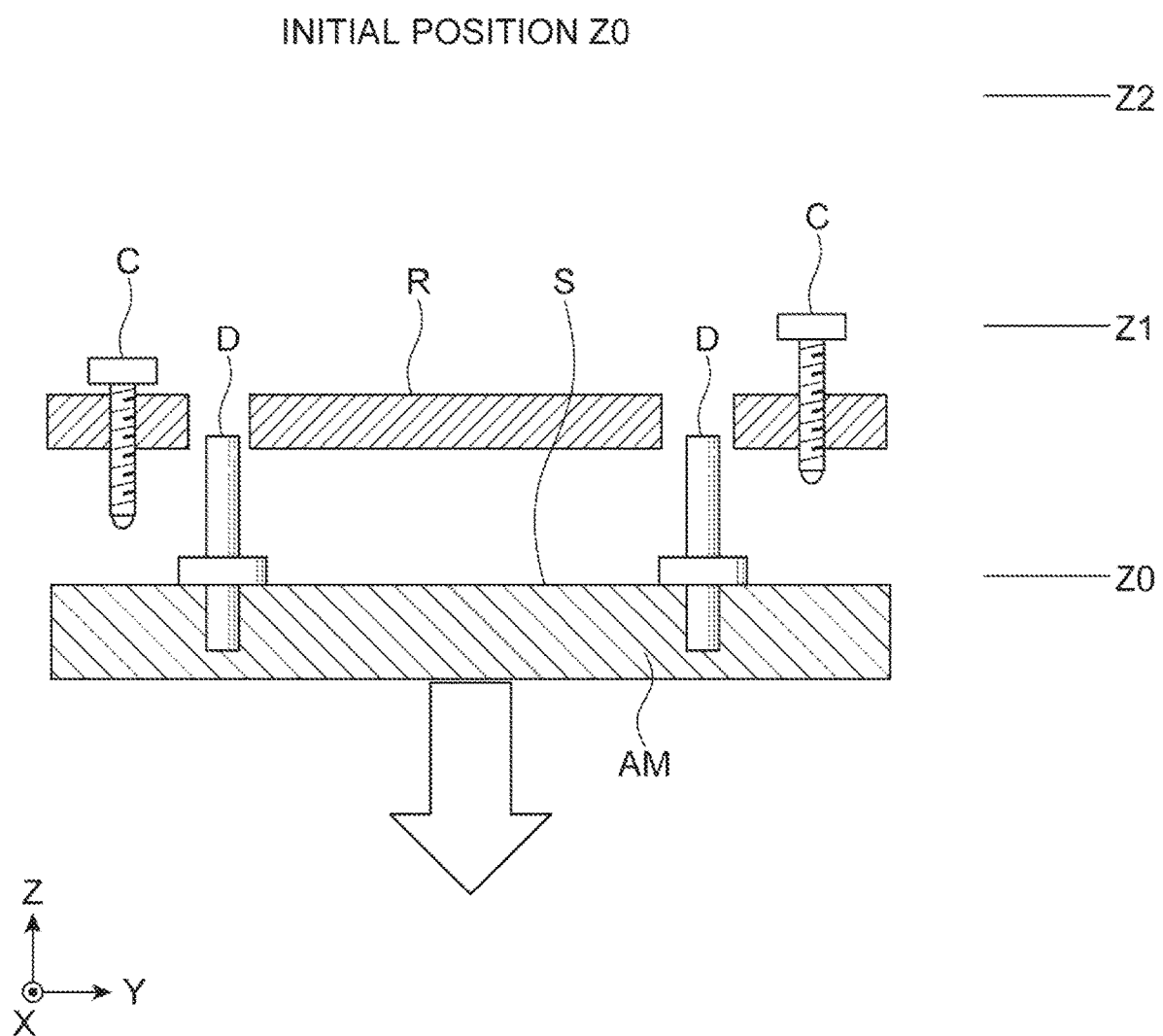
FIG. 11 is a view illustrating a longitudinal cross section (YZ cross section) in the vicinity of the arm showing a state in which the arm shown in FIG. 10 is lowered to an initial position Z0.

In a case where the arm AM is at the initial position Z0 in FIG. 6 or FIG. 11 (the position of the reference surface S is the initial position Z0), the pin A in FIG. 6 penetrates the ring R, and at the other positions of the ring R, the ring R is fixed to the processing vessel 2 by a plurality of bolts B (twelve pieces in FIG. 8), rather than the pin A. That is, the bolt B penetrates the spacer 21 of FIG. 6 and is screwed into a screw hole provided at the upper end portion of the processing vessel 2. Thus, the ring R and the processing vessel 2 are structurally, thermally and electrically stable. Further, it is preferable that the plurality of bolts B are disposed at regular intervals. (In FIG. 8, they are arranged at an angle of 30 degrees).

Through the above construction, even in a case where the relative position between the arm AM and the ring R changes in the horizontal direction due to the own weight of the upper structure and heat, and stress is to be applied to them, it is possible to adjust the distortion and position deviation of the members, in particular, the position of the slot plate 20 included in the upper structure US in the XY plane, and it is possible to suppress the deterioration of the plasma stability due to the distortion and position deviation before and after maintenance. Further, since the tip end of the screw C and the arm AM are separated from each other, the ring R and the upper structure US are not fixed to the arm AM, so even if the upper structure is heated and thermal expansion occurs during the process, the upper structure US is prevented from being distorted by the arm AM which is not heated.

Further, as shown in FIG. 6 and FIG. 11, when the reference surface S of the arm AM is lowered to the initial position Z0 and the ring R abuts the spacer 21, the own weights of the ring R and the upper structure US are moved from the arm AM to the spacer 21, and the deflection of the arm AM is recovered, but since the ring R and the upper structure US are not fixed to the arm AM, a force of pushing up the ring R through the screw CX due to recovery of deflection of the arm AM does not occur.

On the other hand, in a case where a bolt D1 is used instead of the pin D and a bolt (a screw CX) without a ball is used instead of the screw C, the following problems occur.

Figure 12:
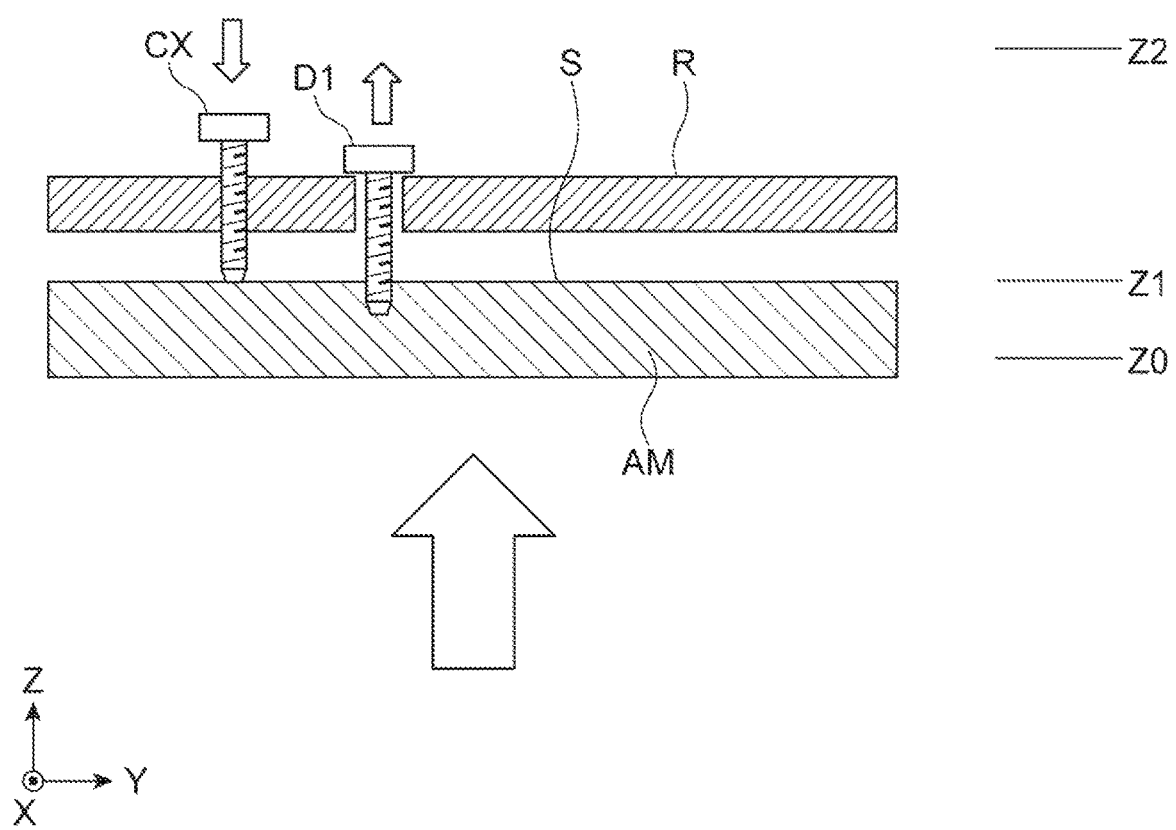
FIG. 12 is a view illustrating a longitudinal cross section (YZ cross section) in the vicinity of an arm of a plasma processing apparatus according to a comparative example.
Figure 13:
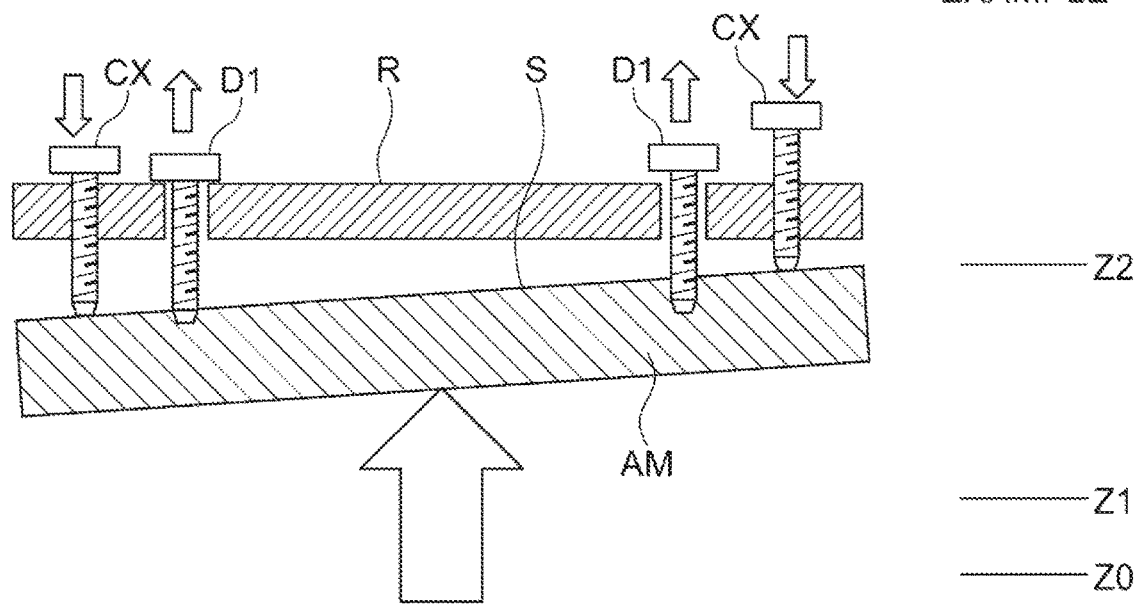
FIG. 13 is a view illustrating a longitudinal sectional configuration in the vicinity of the arm in the case where there are two pairs of screws C and pins D, which are separated along a Y-axis direction.

FIG. 12 is a view illustrating a longitudinal cross section (YZ cross section) in the vicinity of an arm according to a comparative example, in the same place as in FIG. 9. FIG. 13 shows a longitudinal sectional configuration in the case where there are two pairs of screw C and pin D, which are separated along the Y-axis direction. It may be considered that the pair on the right side in FIG. 10 is shown by rotating the pair of C-D closest to the lifting device EL in FIG. 8 by 90 degrees around the Z axis.

The bolt D1 is a pull screw and is screwed into a screw hole provided on the upper surface of the arm AM, and when tightened, the ring R and the arm AM come closer. The screw CX is a push screw, and when it is screwed, the ring R and the arm AM are separated from each other, but unlike the above, the tip end is not a ball. In the same manner as described above, the bolts D1 and the screws CX are disposed at a plurality of places on the ring R.

In this case, when attempting to raise the arm AM from the state of FIG. 12, the arm AM receives the weight of the upper structure US, the arm AM is deflected, and the ring R and the upper structure US are inclined, the dielectric window 16 and the upper structure US are not parallel. Therefore, after maintenance, before lowering the arm AM again, the bolts D1 and screws CX are adjusted such that the ring R and the upper structure US are horizontal with respect to the dielectric window 16 by the plurality of bolts D1 and the screws CX, that is, the upper surface of the ring R is horizontal (FIG. 13). However, since the arm AM and the ring R are fixed by the bolts D1 and the screws CX, the position cannot be adjusted in the XY plane direction. Further, even at the initial position Z0, the bolt D1 and the screw CX fix the ring R to the arm AM. Since the ring R is fixed to the arm AM, in the comparative example, the distance between the initial position Z0 and the first position Z1 is shorter than the distance in the case of the structure of the above embodiment.

Figure 14:
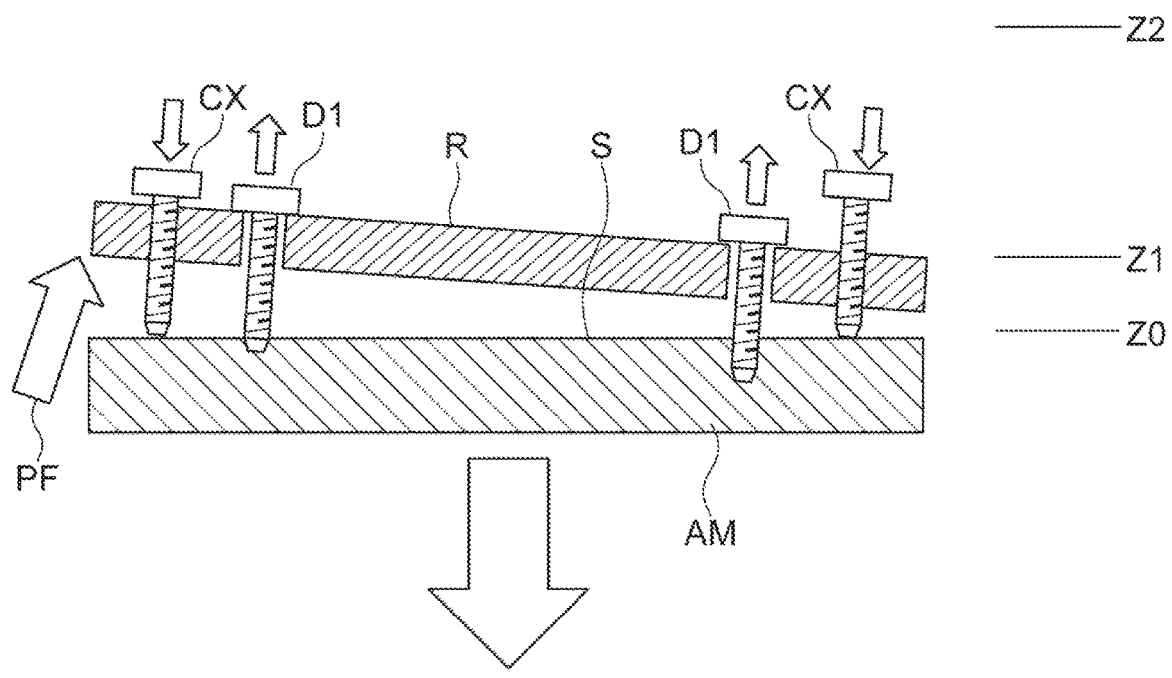
FIG. 14 is a view illustrating a longitudinal cross section (YZ cross section) in the vicinity of the arm showing a state in which the arm shown in FIG. 13 is lowered to an initial position Z0.

After the horizontal adjustment of the ring R, when the arm AM is lowered to the initial position Z0 (FIG. 14), the ring R abuts the spacer 21 shown in FIG. 6, and the own weights of the ring R and the upper structure US move from the arm AM to the spacer 21. Then, the deflection of the arm AM is recovered and a force PF of pushing up the ring R through the screw CX is generated. Therefore, in some cases, due to the pushing-up force PF, the inclination opposite to the inclination of the arm due to the weight of the upper structure is made, so that the parallelism between the dielectric window 16 and the upper structure US, especially the slot plate 20 cannot be maintained, which is a factor of impeding the stability of the plasma.

As described above, the above-described plasma processing apparatus includes a processing vessel 2, an upper structure US that is provided on an upper portion of the processing vessel 2 and generates plasma in a lower region thereof, a structure holding ring R that is fixed around the upper structure US, an arm AM that supports the ring and is movable up and down, a screw C (including a bolt) that is fixed to one of the ring R and the arm AM, and has a tip end abutting the other, and a pin D that is provided in the ring or the arm and passes through a hole for restricting horizontal movement of the ring R.

In this case, when the upper structure US is moved upward, even if the upper structure (and the ring R) is inclined due to the deflection of the arm AM by its own weight, the upper structure can be adjusted to be horizontal by the screw C, and can be adjusted in the horizontal direction by the ball structure of the tip end of the screw C. According to this structure, when the upper structure US is moved downward, the positioning of the upper structure is always accurately performed with respect to the dielectric window 16, and plasma is stably generated.

Further, it is preferable that the tip end of the screw C is made of a ball that is rotatably held. In this case, even if the ring R moves slightly in the horizontal direction, unnecessary horizontal force is not applied to the upper structure due to the presence of the ball, so that the positioning of the upper structure is accurately performed, and plasma is stably generated.

Figure 15:
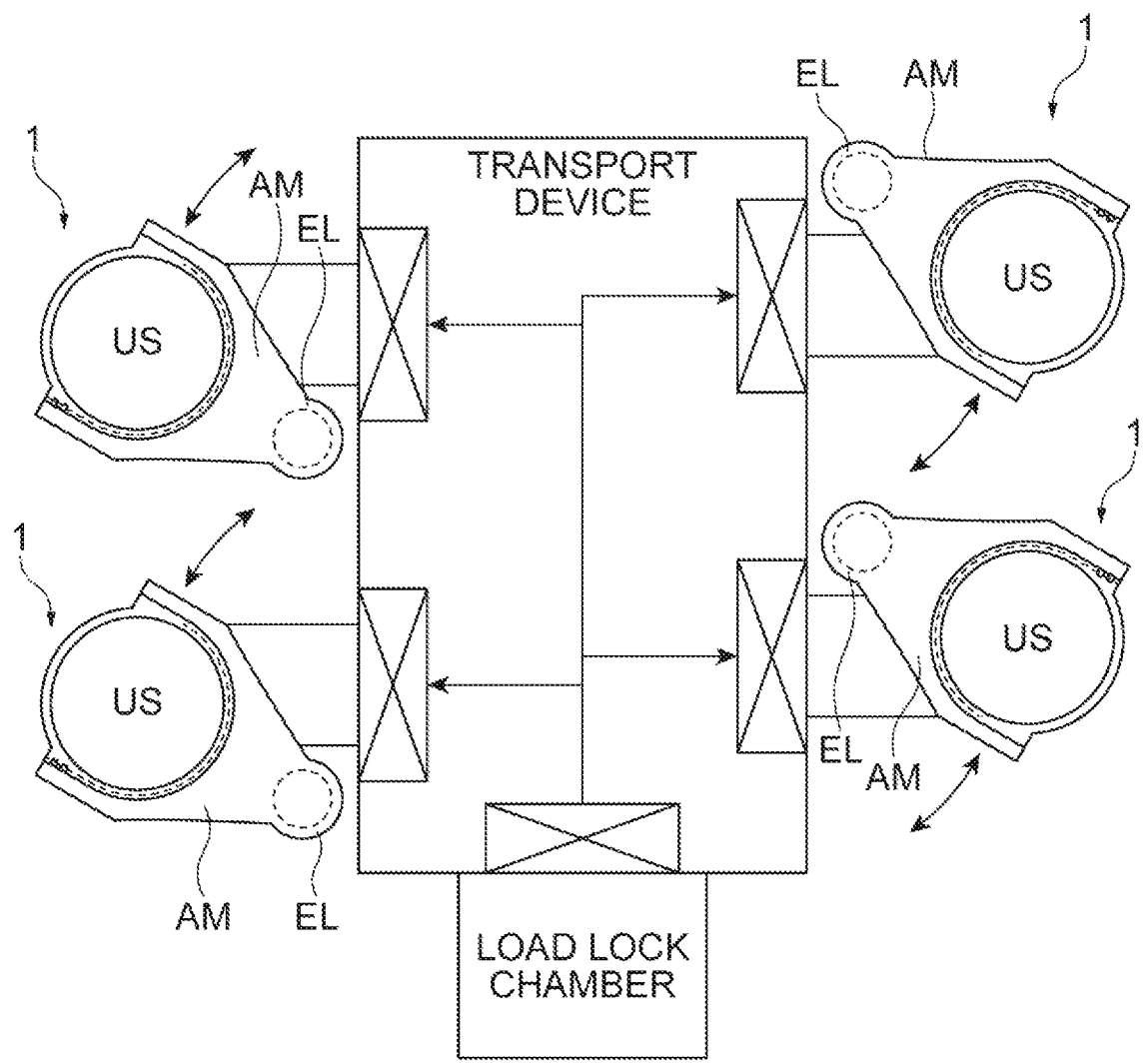
FIG. 15 is a diagram illustrating a system configuration having a plurality of plasma processing apparatuses.

FIG. 15 is diagram illustrating a system configuration having a plurality of plasma processing apparatuses.

A plurality of arms AM and a lifting device EL are disposed around a transport device including a chamber. The wafer to be processed is transported from the load lock chamber into the plasma processing apparatus 1 through the transport device. Here, since the arm AM can rotate in the horizontal plane, the arm AM can be positioned on the transport device after rotation, and the space can be effectively utilized.

In the above-described upper structure, plasma is generated immediately below the dielectric window by irradiating the slot plate with microwaves. However, it is also possible to use an inductive coupling type plasma processing apparatus (ICP) using a dielectric window and a coil antenna or a parallel flat plate type plasma processing apparatus using parallel flat plates. In the case of the inductive coupling type plasma processing apparatus, for example, an upper structure including a coil antenna is held, and in the case of the parallel flat type plasma processing apparatus, for example, an upper structure including one of the parallel flat plate electrodes is held. That is, the present invention is also applicable to a plasma processing apparatus that applies high frequency power to a coil antenna or an upper electrode located at the upper portion of a processing vessel to generate plasma in the processing vessel.

Further, the distance (in the Z direction) between the ring R and the arm AM can be adjusted according to the rotation amount of the screw C, and the position of the ring R relative to the arm AM in the XY plane can be adjusted by the ball at the tip end of the screw C. However, the shape of a screw or a bolt is not limited but may be substituted as long as the position relationship between the ring R and the arm AM can be varied in the XY direction and the Z direction. In addition, the function may be divided such that the XY direction and the Z direction are independently varied.

What is claimed is:

1. A plasma processing apparatus comprising:
a processing vessel;
an upper structure that is provided on an upper portion of the processing vessel and generates plasma in a lower region thereof;
a structure holding ring that is fixed around the upper structure;
an arm that supports the ring and is movable up and down;
a screw that is fixed to one of the ring and the arm, and has a tip abutting the other; and
a pin that is provided in the ring or the arm, and passes through a hole for restricting horizontal movement of the ring, wherein
the pin is movable within the hole,
the screw does not fix the ring to the arm, and
the tip of the screw is slidable in a horizontal direction on a reference surface that the tip abuts.

2. A plasma processing apparatus comprising:
a processing vessel;
an upper structure that is provided on an upper portion of the processing vessel and generates plasma in a lower region thereof;
a structure holding ring that is fixed around the upper structure;
an arm that supports the ring and is movable up and down;
a screw that is fixed to one of the ring and the arm, and has a tip abutting the other; and
a pin that is provided in the ring or the arm, and passes through a hole for restricting horizontal movement of the ring, wherein
the pin is movable within the hole,
the tip of the screw comprises a rotatable ball,
the screw does not fix the ring to the arm, and
the ball of the screw is slidable in a horizontal direction on a reference surface that the rotatable ball abuts.

* * * * *